(12) United States Patent
Murphy et al.

(10) Patent No.: US 10,644,681 B2
(45) Date of Patent: May 5, 2020

(54) LOW-POWER LOCAL OSCILLATOR GENERATION

(71) Applicant: Avago Technologies General IP (Singapore) Pte. Ltd., Singapore (SG)

(72) Inventors: David Patrick Murphy, Long Beach, CA (US); Xiongchuan Huang, San Diego, CA (US); Hooman Darabi, Laguna Niguel, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 74 days.

(21) Appl. No.: 15/799,878

(22) Filed: Oct. 31, 2017

(65) Prior Publication Data
US 2018/0241379 A1    Aug. 23, 2018

Related U.S. Application Data

(60) Provisional application No. 62/462,894, filed on Feb. 23, 2017.

(51) Int. Cl.
*H03K 21/00* (2006.01)
*H03K 3/03* (2006.01)
(Continued)

(52) U.S. Cl.
CPC ....... *H03K 3/0315* (2013.01); *H03K 5/15013* (2013.01); *H03K 21/00* (2013.01);
(Continued)

(58) Field of Classification Search
CPC ...... H03K 3/0315; H03K 21/00; H03K 23/64; H03K 23/66; H03K 23/667; H03K 23/68;
(Continued)

(56) References Cited

U.S. PATENT DOCUMENTS

| | | | | |
|---|---|---|---|---|
| 4,091,335 A | * | 5/1978 | Giolma | H03K 3/0315 331/1 A |
| 5,180,994 A | * | 1/1993 | Martin | H03B 27/00 331/38 |

(Continued)

*Primary Examiner* — Levi Gannon
(74) *Attorney, Agent, or Firm* — Morgan, Lewis & Bockius LLP

(57) ABSTRACT

A circuit for providing a fractional divider/multiplier using harmonic recombination may include a power amplifier, an oscillator coupled to the power amplifier, and a divider coupled to the oscillator. In one or more implementations, the divider is configured to generate one or more phases of a harmonic from the oscillator to reduce signal interference from the power amplifier. In one or more implementations, the divider includes a divide-by-M divider, where M is a positive integer, and an array of transconductance cells coupled to the output of the divide-by-M divider. In one or more implementations, the divider includes an inductor or a filter coupled to the output of the array of transconductance cells. In one or more implementations, the oscillator includes a logical gate and a resistor-capacitor circuit coupled in series feedback with a multi-stage ring oscillator. The oscillator may include a divider coupled to the multi-stage ring oscillator.

12 Claims, 9 Drawing Sheets

(51) Int. Cl.
*H03L 7/081* (2006.01)
*H04B 1/04* (2006.01)
*H03L 7/183* (2006.01)
*H03K 5/15* (2006.01)
*H03L 7/099* (2006.01)
*H03L 7/18* (2006.01)
*H03K 19/21* (2006.01)

(52) U.S. Cl.
CPC .............. *H03L 7/081* (2013.01); *H03L 7/099* (2013.01); *H03L 7/18* (2013.01); *H03L 7/183* (2013.01); *H03K 19/21* (2013.01); *H04B 2001/0408* (2013.01)

(58) Field of Classification Search
CPC ....... H03K 23/70; H03L 7/081; H03L 7/0995; H03L 7/0996; H04B 1/02; H04B 1/04; H04B 2001/0408
USPC ........................................................ 331/57
See application file for complete search history.

(56) References Cited

U.S. PATENT DOCUMENTS

| | | | | |
|---|---|---|---|---|
| 5,561,398 | A * | 10/1996 | Rasmussen | H03K 3/0231 331/116 FE |
| 6,094,103 | A * | 7/2000 | Jeong | H03B 5/24 331/57 |
| 6,486,830 | B1 * | 11/2002 | Kohno | H01Q 3/26 342/380 |
| 7,233,772 | B1 * | 6/2007 | Darabi | H03B 21/01 323/237 |
| 8,165,538 | B2 * | 4/2012 | Pullela | H03D 7/1441 455/114.1 |
| 9,099,959 | B2 * | 8/2015 | Yamaji | H03B 19/14 |
| 2008/0218217 | A1 * | 9/2008 | Masuda | H03D 13/004 327/42 |
| 2012/0007651 | A1 * | 1/2012 | Meng | H03K 23/50 327/356 |
| 2018/0115410 | A1 * | 4/2018 | Tajalli | H03L 7/0996 |
| 2018/0123575 | A1 * | 5/2018 | Huang | H03K 5/15046 |

* cited by examiner

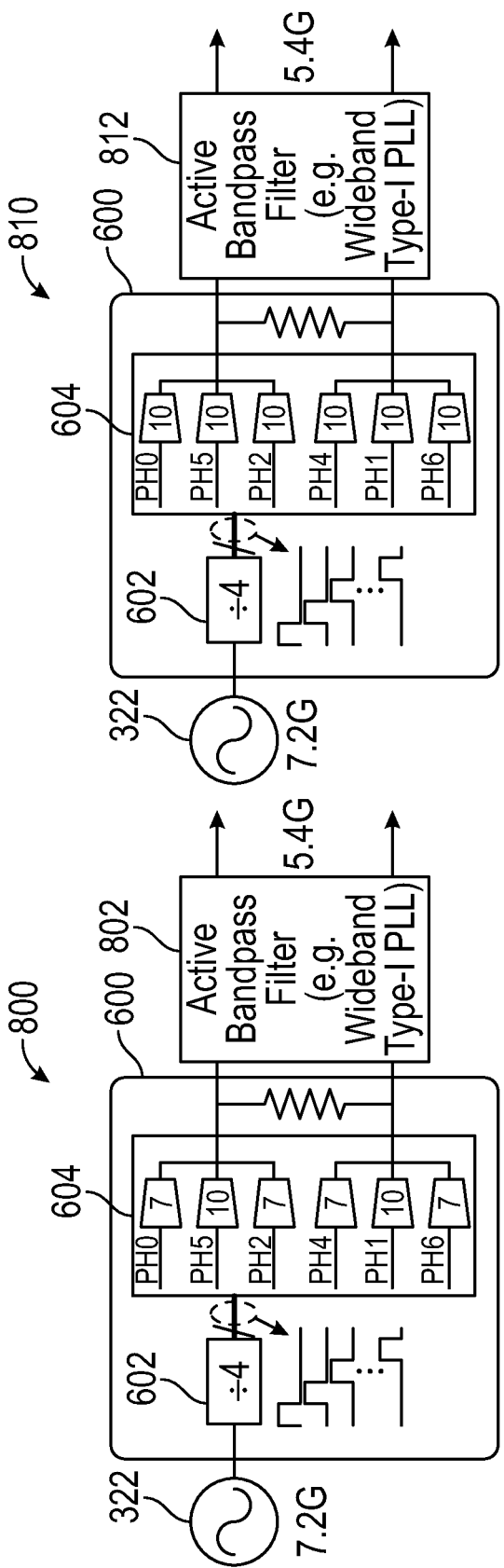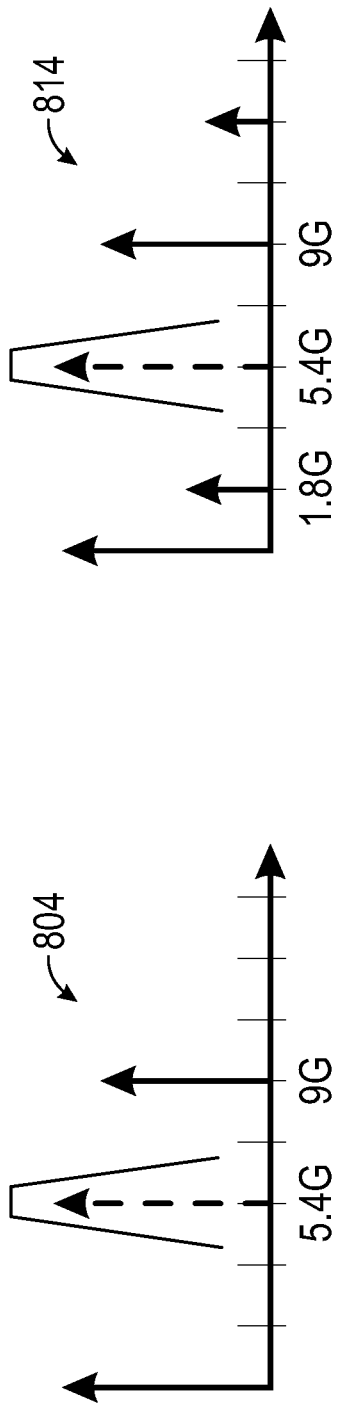
FIG. 8A
FIG. 8B

LOW-POWER LOCAL OSCILLATOR GENERATION

CROSS-REFERENCE TO RELATED APPLICATIONS

This application claims the benefit of priority under 35 U.S.C. § 119 from U.S. Provisional Patent Application 62/462,894, entitled "LOW-POWER LOCAL OSCILLATOR GENERATION," filed Feb. 23, 2017, which is incorporated herein by reference in its entirety.

TECHNICAL FIELD

The present description relates generally to wireless communication systems, and more particularly, but not exclusively, to low-power local oscillator (LO) generation.

BACKGROUND

Local oscillator (LO) generation for wireless systems can experience signal degradation originating along the LO path and signal interference from remote electrical components. For example, a power amplifier (PA) coupling into a harmonic of an oscillator (OSC) can cause pulling. As a result of the pulling, a voltage-controlled oscillator (VCO) output will not be a single tone anymore and will have unwanted frequency components. For example, the transmitter pulling causes the VCO frequency to spread around its center and will have unwanted sidebands. The unwanted frequency components can degrade the transmitter performance. Traditional fractional divider/multipliers in the LO path can mitigate the PA-to-OSC pulling. However, duty cycle correction in the LO path by the fractional divider/multiplier results in performance degradation of the LO generation. In other instances, I/Q signal generation for baseband processing typically requires a resistor-capacitor-capacitor-resistor (RCCR) circuit implementation. However, the resistor-capacitor (RC) attenuation on the input signal and input impedance observed on the RCCR circuit results in further performance degradation of the LO generation.

BRIEF DESCRIPTION OF THE DRAWINGS

Certain features of the subject technology are set forth in the appended claims. However, for purpose of explanation, several embodiments of the subject technology are set forth in the following figures.

FIG. 8A is a diagram illustrating an example of a multiphase divider with unequal weighting coupled to an active bandpass filter in accordance with one or more implementations.

FIG. 8B is a diagram illustrating an example of a multiphase divider with equal weighting coupled to an active bandpass filter in accordance with one or more implementations.

The accompanying appendix, which is included to provide further understanding of the subject technology and are incorporated in and constitute a part of this specification, illustrate aspects of the subject technology and together with the description serve to explain the principles of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

A transmitter circuit includes an oscillator and a divider coupled to the oscillator, in which the divider is configured to generate one or more phases of a harmonic from the oscillator. The transmitter circuit also includes an I/Q generator coupled to the divider, in which the I/Q generator is configured to generate a plurality of phase-shifted clock signals from the harmonic. The transmitter circuit also includes a frequency conversion circuit configured to convert the plurality of phase-shifted clock signals to an outbound frequency. The transmitter circuit also includes a power amplifier configured to transmit the frequency converted clock signals.

Figure 1:
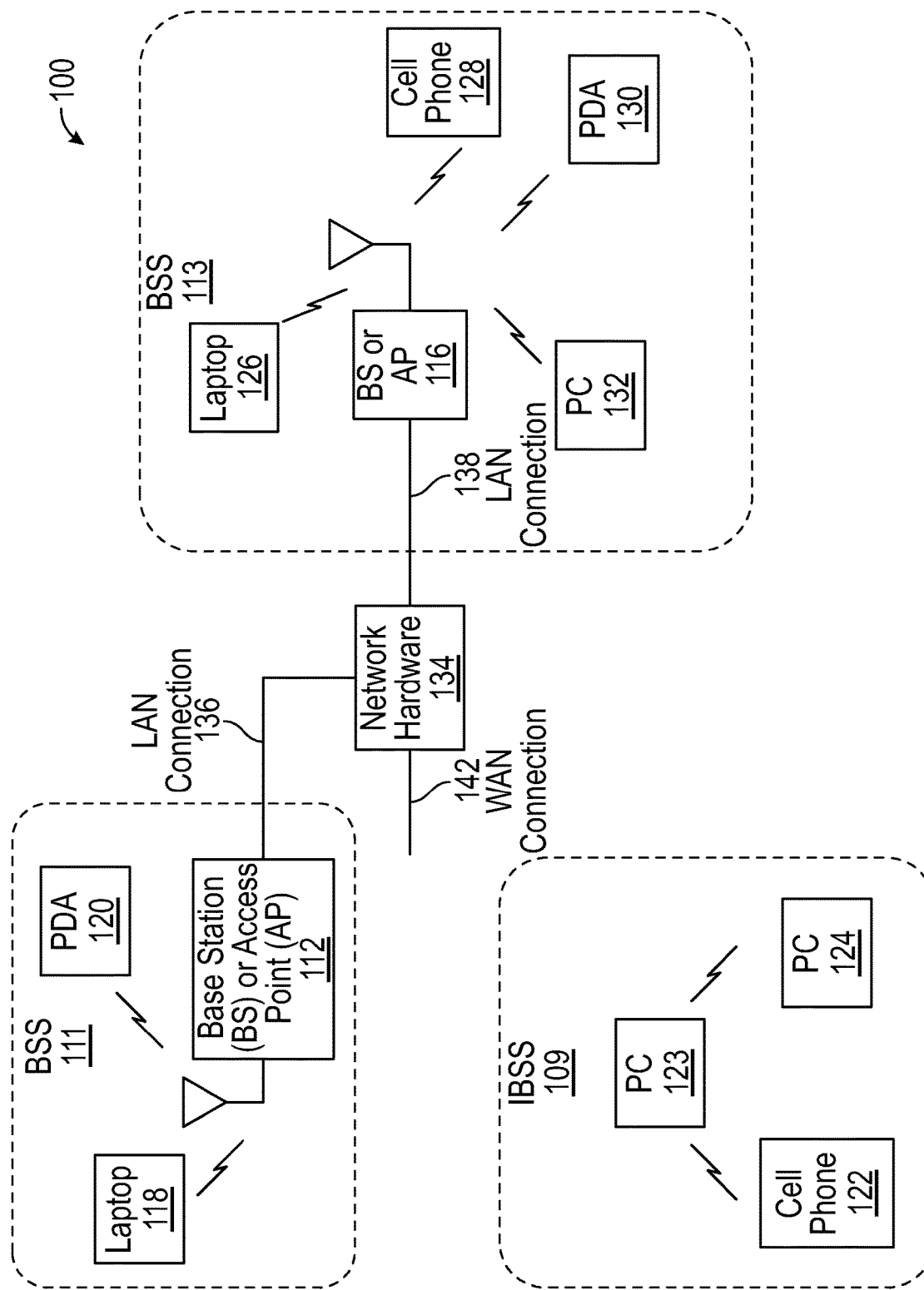
FIG. 1 is a diagram illustrating a wireless communication system in accordance with one or more implementations.

FIG. 1 is a diagram illustrating wireless communication system 100 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Wireless communication system 100 includes base stations and/or access points 112, 116, wireless communication devices 118-132 and a network hardware component 134. Note that the network hardware 134, which may be a router, switch, bridge, modem, or system controller, provides a wide area network connection 142 for the wireless communication system 100. Further note that wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within independent basic service set (IBSS) area 109 and communicate directly (e.g., point to point). In this configuration, wireless communication devices 122, 123, and 124 may only communicate with each other. To communicate with other wireless communication devices within the wireless communication system 100 or to communicate outside of the wireless communication system 100, wireless communication devices 122, 123, and/or 124 can affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access points 112, 116 with connectivity to other devices within the wireless communication system 100 and provides connectivity to other networks via the WAN connection 142. To communicate with wireless communication devices 118-132 within BSS 111 and 113, each of the base stations or access points 112, 116 has an associated antenna or antenna array. In one or more implementations, base station or access point 112 wirelessly communicates with wireless communication devices 118 and 120 while base station or access point 116 wirelessly communicates with wireless communication devices 126-132. Wireless communication devices 118-132 can register with a particular base station or access point 112, 116 to receive services from the wireless communication system 100.

According to some implementations, base stations are used for cellular telephone systems (e.g., long-term evolution (LTE), advanced mobile phone services (AMPS), digital AMPS, global system for mobile communications (GSM), code division multiple access (CDMA), local multipoint distribution systems (LMDS), multi-channel-multi-point distribution systems (MMDS), enhanced data rates for GSM evolution (EDGE), general packet radio service (GPRS), high-speed downlink packet access (HSDPA), high-speed uplink packet access (HSDPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
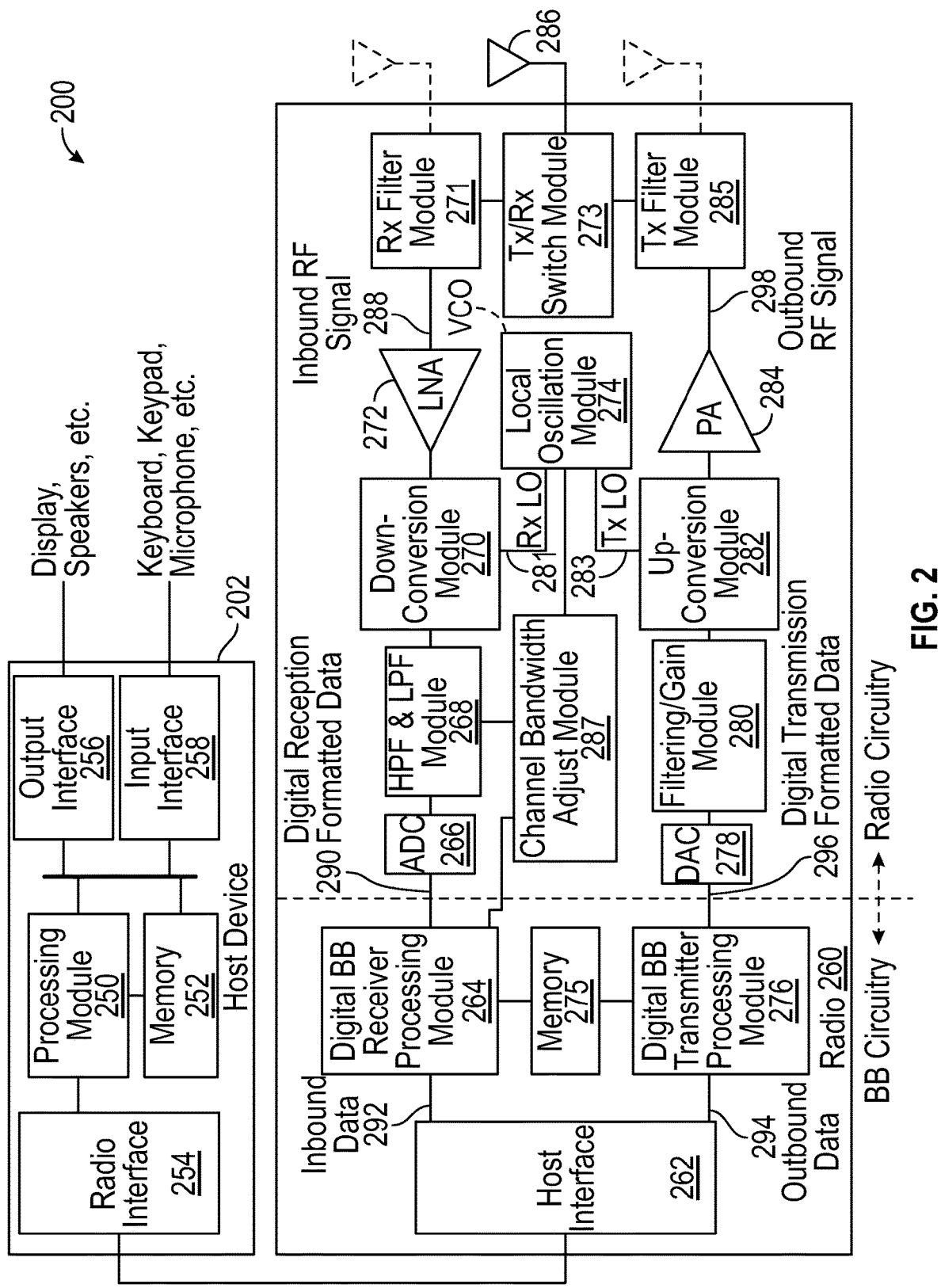
FIG. 2 is a diagram illustrating a wireless communication device that includes a host device and an associated radio in accordance with one or more implementations.

FIG. 2 is a diagram illustrating a wireless communication device 200 that includes a host device 202 (e.g., wireless communication devices 118-132) and associated radio 260. For cellular telephone hosts, radio 260 is a built-in component. For personal digital assistants hosts, laptop hosts, and/or personal computer hosts, the radio 260 may be built-in or an externally coupled component. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

As illustrated, host device 202 includes processing module 250, memory 252, radio interface 254, input interface 258, and output interface 256. Processing module 250 is configured to execute corresponding instructions stored in memory 275 that can be performed by host device 202. For example, for a cellular telephone host device, processing module 250 performs the corresponding communication functions in accordance with a particular cellular telephone standard.

Radio interface 254 allows data to be received from and sent to radio 260. For data received from the radio 260 (e.g., inbound data), radio interface 254 provides the data to processing module 250 for further processing and/or routing to output interface 256. Output interface 256 provides connectivity to an output display device such as a display, monitor, or speakers, such that the received data may be presented. Radio interface 254 also provides data from processing module 250 to radio 260. Processing module 250 may receive the outbound data from an input device such as a keyboard, keypad, or microphone via input interface 258 or generate the data itself. For data received via input interface 258, processing module 250 may perform a corresponding host function on the data and/or route it to radio 260 via radio interface 254.

Radio 260 includes host interface 262, digital baseband (BB) receiver processing module 264, analog-to-digital converter 266, high pass and low pass filter module 268, inter-frequency (IF) mixing down conversion stage 270, receiver filter module 271, low noise amplifier 272, transmitter/receiver switch 273, local oscillation module 274 (which may be implemented, at least in part, using a voltage controlled oscillator (VCO)), memory 275, digital BB transmitter processing module 276, digital-to-analog converter 278, filtering/gain module 280, intermediate frequency (IF) mixing up-conversion stage 282, power amplifier 284, transmitter filter module 285, channel bandwidth adjust module 287, and antenna 286. Antenna 286 may be a single antenna that is shared by the transmit and receive paths as regulated by Tx/Rx switch module 273, or may include separate antennas for the transmit path and receive path. The antenna implementation will depend on the particular standard to which the wireless communication device is compliant.

Digital receiver processing module 264 and digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

Digital receiver and transmitter processing modules 264 and 276 may be implemented using a shared processing device, individual processing devices, or multiple processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 275 may be a single memory device or multiple memory devices. Such a memory device may be a read-only memory, random access memory, volatile memory, non-volatile memory, static memory, dynamic memory, flash memory, and/or any device that stores digital information. Note that when processing module 264 and/or 276 implements one or more of its functions via a state machine, analog circuitry, digital circuitry, and/or logic circuitry, the memory storing the corresponding operational instructions is embedded with the circuitry including the state machine, analog circuitry, digital circuitry, and/or logic circuitry.

In operation, radio 260 receives outbound data 294 from host device 202 via host interface 262. Host interface 262 routes outbound data 294 to digital transmitter processing module 276, which processes outbound data 294 in accordance with a particular wireless communication standard (e.g., IEEE 802.11, Bluetooth, ZigBee, WiMAX (Worldwide Interoperability for Microwave Access), or any other type of radio frequency based network protocol and/or variations thereof) to produce outbound baseband signals 296. Outbound baseband signals 296 can be digital base-band signals (e.g., have a zero IF) or digital low IF signals, where the low IF can be in the frequency range of one hundred kHz (kilo-Hertz) to a few MHz (Mega-Hertz).

Digital-to-analog converter 278 converts outbound baseband signals 296 from the digital domain to the analog domain. Filtering/gain module 280 filters and/or adjusts the gain of the analog signals prior to providing the signals to IF mixing stage 282. IF mixing stage 282 converts the analog baseband or low IF signals into radio frequency (RF) signals based on transmitter local oscillation 283 provided by local oscillation module 274. Power amplifier 284 amplifies the RF signals to produce outbound RF signals 298, which are filtered by transmitter filter module 285. Antenna 286 transmits outbound RF signals 298 to a targeted device such as a base station, an access point and/or another wireless communication device.

Radio 260 also receives inbound RF signals 288 via antenna 286, which are transmitted by a base station, an access point, or another wireless communication device. Antenna 286 provides inbound RF signals 288 to receiver filter module 271 via Tx/Rx switch 273, where Rx filter 271 bandpass filters inbound RF signals 288. Rx filter 271 provides the filtered RF signals to low noise amplifier 272, which amplifies inbound RF signals 288 to produce amplified inbound RF signals. Low noise amplifier 272 provides the amplified inbound RF signals to IF mixing module 270, which directly converts the amplified inbound RF signals into an inbound low IF signals or baseband signals based on receiver local oscillation 281 provided by local oscillation module 274. Down conversion module 270 provides the inbound low IF signals or baseband signals to filtering/gain module 268. High pass and low pass filter module 268 filters, based on settings provided by channel bandwidth adjust module 287, the inbound low IF signals or the inbound baseband signals to produce filtered inbound signals.

Analog-to-digital converter 266 converts the filtered inbound signals from the analog domain to the digital domain to produce inbound baseband signals 290, where inbound baseband signals 290 will be digital base-band signals or digital low IF signals, where the low IF typically will be in the frequency range of one hundred kHz to a few MHz. Digital receiver processing module 264, based on settings provided by channel bandwidth adjust module 287, decodes, descrambles, demaps, and/or demodulates inbound baseband signals 290 to recapture inbound data 292 in accordance with the particular wireless communication standard being implemented by radio 260. Host interface 262 provides recaptured inbound data 292 to host device 202 via radio interface 254.

Wireless communication device 200 may be implemented using one or more integrated circuits. For example, the host device 202 may be implemented on a first integrated circuit, digital receiver processing module 264, digital transmitter processing module 276 and memory 275 may be implemented on a second integrated circuit, and the remaining components of radio 260, less antenna 286, may be implemented on a third integrated circuit. Alternatively, radio 260 may be implemented on a single integrated circuit. As yet another example, processing module 250 of host device 202 and digital receiver and transmitter processing modules 264 and 276 may be a common processing device implemented on a single integrated circuit. Further, memory 252 and memory 275 may be implemented on a single integrated circuit and/or on the same integrated circuit as the common processing modules of processing module 250 and digital receiver and transmitter processing module 264 and 276.

Any of the various embodiments of the wireless communication device 200 that may be implemented within various communication systems can incorporate functionality to perform communication via more than one standard, protocol, or other predetermined means of communication. For example, the wireless communication device 200 implemented as a single communication device, can include functionality to perform communication in accordance with a first protocol, a second protocol, and/or a third protocol. These various protocols may be WiMAX (Worldwide Interoperability for Microwave Access) protocol, a protocol that complies with a wireless local area network (e.g., WLAN/WiFi) (e.g., one of the IEEE (Institute of Electrical and Electronics Engineer) 802.11 protocols such as 802.11a, 802.11b, 802.11g, 802.11n, or 802.11ac), a Bluetooth protocol, or any other predetermined means by which wireless communication may be effectuated.

According to some implementations in which the radio 260 within the wireless communication device 200 may initiate transmission of a communication (e.g., such as a packet), certain components within the radio 260 (e.g., a power amplifier (PA), and/or any other component such as those that draw relatively high amounts of current) may undesirably cause frequency jumps in one or more components within the radio 260. In particular, some components within the radio 260 may be relatively more susceptible to be deleteriously affected by such operations being performed within the radio 260 (e.g., the powering on of a PA and/or any other component such as those drawing high current). One such example of a component in the radio 260 that may be deleteriously affected by powering on or operation of certain components in the radio 260 is a voltage controlled oscillator (VCO) in the radio 260. For example, the powering on of the PA in the radio 260 may unfortunately result in a "frequency spike" in the carrier signal of the transmission path of the radio 260. In some aspects, a fractional divider is coupled to the VCO and PA to mitigate the interference from the PA along the LO path. However, the duty cycle correction in traditional fractional dividers increases phase noise in the carrier signal. As the radio 260 operates, this phase noise overhead of the duty-cycle correction may unfortunately result in a communication (e.g., packet) being decoded incorrectly within a remote radio because of carrier phase errors therein.

Figure 3:
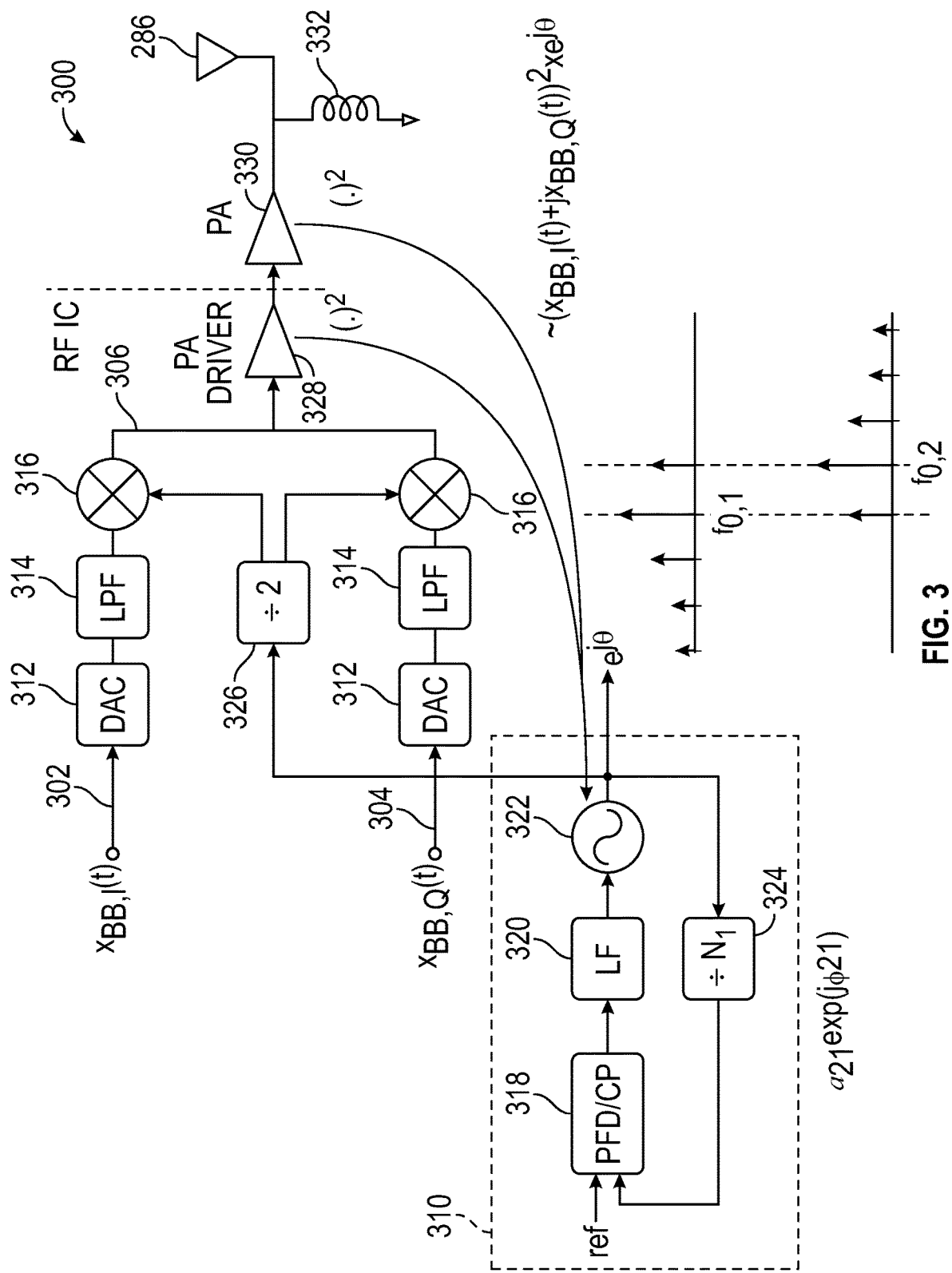
FIG. 3 is a diagram illustrating a transmitter portion of the radio illustrated in FIG. 2 in accordance with one or more implementations.

FIG. 3 illustrates transmitter portion 300 of radio 260 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Transmitter portion 300 includes in-phase (I) component path 302 and quadrature (Q) component path 304 to output upconverted RF signal 306 for transmission via antenna 286 (FIG. 2). Transmitter portion 300 also includes one or more frequency-control circuits 310 (e.g., phase-locked loops). For each of I and Q component paths 302 and 304, transmitter portion 300 includes digital-to-analog converter (DAC) 312, low-pass filter (LPF) 314, and mixer 316. Transmitter circuit 300 further includes power amplifier (PA) driver 328 coupled to power amplifier 330.

In operation, transmitter portion 300 receives an outbound signal including I and Q component signals (e.g., $X_{BB,I}(t)$, $X_{BB,Q}(t)$) for processing on respective paths (e.g., I component path 302 and Q component path 304). In this regard, the outbound signal can be operable at baseband frequencies (e.g., 1 MHz). I and Q components paths 302 and 304 can represent up-conversion paths, where the I and Q component signals are up-converted to a radio frequency that is greater (or substantially greater) in frequency than the outbound signal.

Each of the I and Q component signals is converted from the digital domain to the analog domain by digital-to-analog converter 312. In turn, the analog version of the outbound signal is filtered through low-pass filter 314 to attenuate any frequency components of the respective component of the outbound signal that are present outside a defined bandwidth. Frequency-control circuits 310 each produces a frequency output that is mixed (e.g., frequency-converted) with the filtered version of the outbound signal using mixer 316. In one or more implementations, the output of frequency-control circuit 310 is divided by two by I/Q generator 326 to provide the up-conversion effect of mixer 316. In this regard, the output of frequency-control circuit 310 can be divided by any positive integer to increase the conversion frequency. In some implementations, the I/Q generator 326 includes an RCCR circuit.

The output of mixer 316 is then fed to power amplifier driver 328 for amplification of the outbound signal, then output to power amplifier 330. Power amplifier 330 outputs upconverted RF signal 306, which is the resulting version of the outbound signal for transmission via antenna 286.

According to some implementations, frequency-control circuit 310 is a closed-loop system based on the phase difference between an input clock signal (e.g., a reference frequency) and a feedback clock signal of a controlled oscillator. The frequency-control circuit 310 includes phase frequency detector (PFD) 318, loop filter 320, voltage-controlled oscillator (VCO) 322 and frequency divider 324. PFD 318 is configured to detect a difference in phase and frequency between the input clock signal (e.g., ref) and the feedback clock signal, and generate a detection signal based on whether the feedback frequency is lagging or leading the reference frequency.

In one or more implementations, PFD 318 includes a charge-pump (not shown) that is configured to drive current into or draw current from loop filter 320 based on the detection signal. For example, if the detection signal has an indication to increase the feedback frequency, then the charge-pump drives current proportionate to the indicated increase. Conversely, if the detection signal has an indication to decrease the feedback frequency, then the charge-pump draws current proportionate to the indicated decrease.

Loop filter 320 is configured to convert the detection signal into a control voltage that is used to bias VCO 322. Loop filter 320 can be configured to remove glitches from the charge-pump and prevent voltage overshoot. In one or more implementations, loop filter 320 is a low-pass filter that attenuates frequency components outside a given bandwidth. The control voltage determines whether VCO 322 needs to operate at a higher or lower frequency, which affects the phase and frequency of the feedback clock signal. VCO 322 is configured to receive the control voltage signal 206 and generate an output frequency signal. If the detection signal indicates an increase, then the VCO frequency increases. Conversely, if the detection signal indicates a decrease, then the VCO frequency decreases. VCO 322 stabilizes once the input clock signal and the feedback clock signal have the same phase and frequency. In this regard, frequency-control circuit 310 is considered locked when the input clock signal and the feedback clock signal are aligned.

Frequency divider 324 is configured to increase the VCO frequency (or feedback frequency) above the reference frequency by some integer multiple (e.g., N). That is, the VCO frequency is equal to N times the input clock signal. Therefore, the feedback clock signal of VCO 322 applied to one input of PFD 318 is locked to the frequency-divided clock signal applied to the other input of PFD 318.

Depending on implementation, DAC 312, LPF 314, mixer 316 and PA driver 328 may be integrated onto a single chip or die (e.g., a radio frequency integrated circuit). The components integrated onto the radio frequency integrated circuit can be implemented using system-on-chip (SOC) and configured to provide a standardized power amplifier driver output, for example, to enable the interchangeability of off-chip components. Off-chip component parts, such as PA 330, may be supplied by various third-party vendors and implemented using gallium arsenide (GaAs). To facilitate the interchangeability of off-chip components, the radio frequency integrated circuit and particularly PA driver 328 can be configured to operate with an interface (not shown) having a standardized impedance. By way of example, PA driver 328 can be configured to couple with the interface having an impedance between 45 and 55 ohms.

Power amplifiers and/or power amplifier drivers can be high current drawing and/or high power components that produce a pulling effect that deleteriously affect one or more components in the same radio. According to some implementations, PA driver 328 and PA 330 are high current drawing and/or high power components that provoke such pulling effect on VCO 322. The pulling effect is composed of a pulling component from a second-order non-linearity of PA driver 328 and/or PA 330, which can be proportional to $(X_{BB,I}(t)+jX_{BB,Q}(t))^{2}*e^{j\theta}$, where $X_{BB,I}(t)$ and $X_{BB,Q}(t)$ are baseband signal components, j is an imaginary unit, t is time, and θ is the instantaneous phase of VCO 322. In one or more aspects, radio 260 includes other high current drawing and/or high power components.

Figure 4:
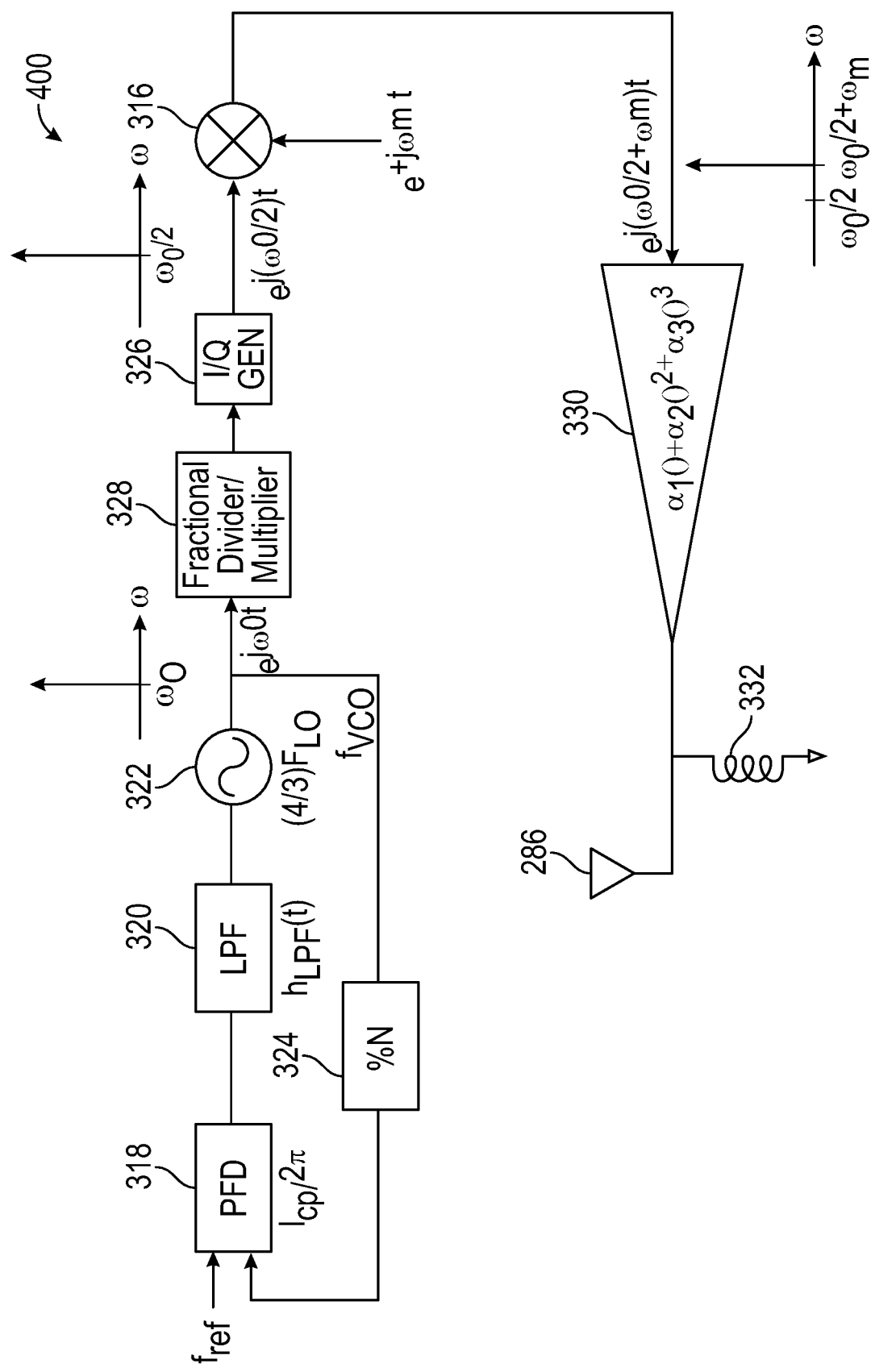
FIG. 4 is a diagram illustrating a transmitter portion of the radio illustrated in FIG. 2 in accordance with one or more implementations.

FIG. 4 is a diagram illustrating transmitter portion 400 of radio 260 illustrated in FIG. 2 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Transmitter portion 400 includes components similar to those discussed in FIGS. 2 and 3 with similar functionality. Transmitter portion 400 includes phase frequency detector (PFD) 318, loop filter 320, voltage-controlled oscillator (VCO) 322, frequency divider 324, FQ generator 326, mixer 316, power amplifier 330 and inductor 332. Transmitter portion 400 absent any pulling effect from high-current drawing and/or high-power components in radio 260 produces single tone signals at the output of VCO 322. In this regard, the single tone signals are present at each output of the components provided in transmitter portion 400.

The transmitter portion 400 also includes a fractional divider/multiplier 328 in series with the VCO 322 and the FQ generator 326. The fractional divider/multiplier 328 in the LO path eliminates PA-to-OSC pulling because the fractional divider/multiplier 328 typically divides the carrier signal by a fraction (e.g., ¾) such that the power amplifier 330 does not couple into a harmonic of the VCO 322.

In operation, VCO 322 receives a control voltage from loop filter 320 that causes VCO 322 to either increase or decrease in frequency. VCO 322 outputs a VCO frequency signal (e.g., $f_{VCO}$) at center frequency, $\omega_0$. In this regard, the VCO frequency signal can be approximately given by $e^{j\omega_0 t}$. The VCO frequency signal is adjusted by FQ generator 326, such that the I/Q generator 326 output frequency is divided by two, for example, the VCO frequency signal. The I/Q generator 326 output can be approximately given by $e^{j(\omega_0/2)t}$. The I/Q generator 326 output is then mixed by complex mixer 316 with a complex baseband input defined as $e^{+j\omega_m t}$. The output of mixer 316 represents an upconverted RF signal that shifts the FQ generator 326 output by $\omega_m$. As such, the single tone can be found at $(\omega_0/2)+\omega_m$. As such, the upconverted RF signal can be approximately given by $e^{j(\omega_0/2+\omega_m)t}$. The PA 330 is given as a quadratic function (e.g., $\alpha_1( )+\alpha_2( )^2+\alpha_3( )^3$). As such, the output of PA 330 emerging from the second-order non-linearity can be approximately given by $\alpha_2 e^{j((\omega_0+2\omega_m)t)}$, where $\alpha$ is a given constant, j is an imaginary unit, $\omega_0$ is the center frequency, and $\omega_m$ is the frequency offset. As such, the single tone can be found at $\omega_0+2\omega_m$.

Figure 5:
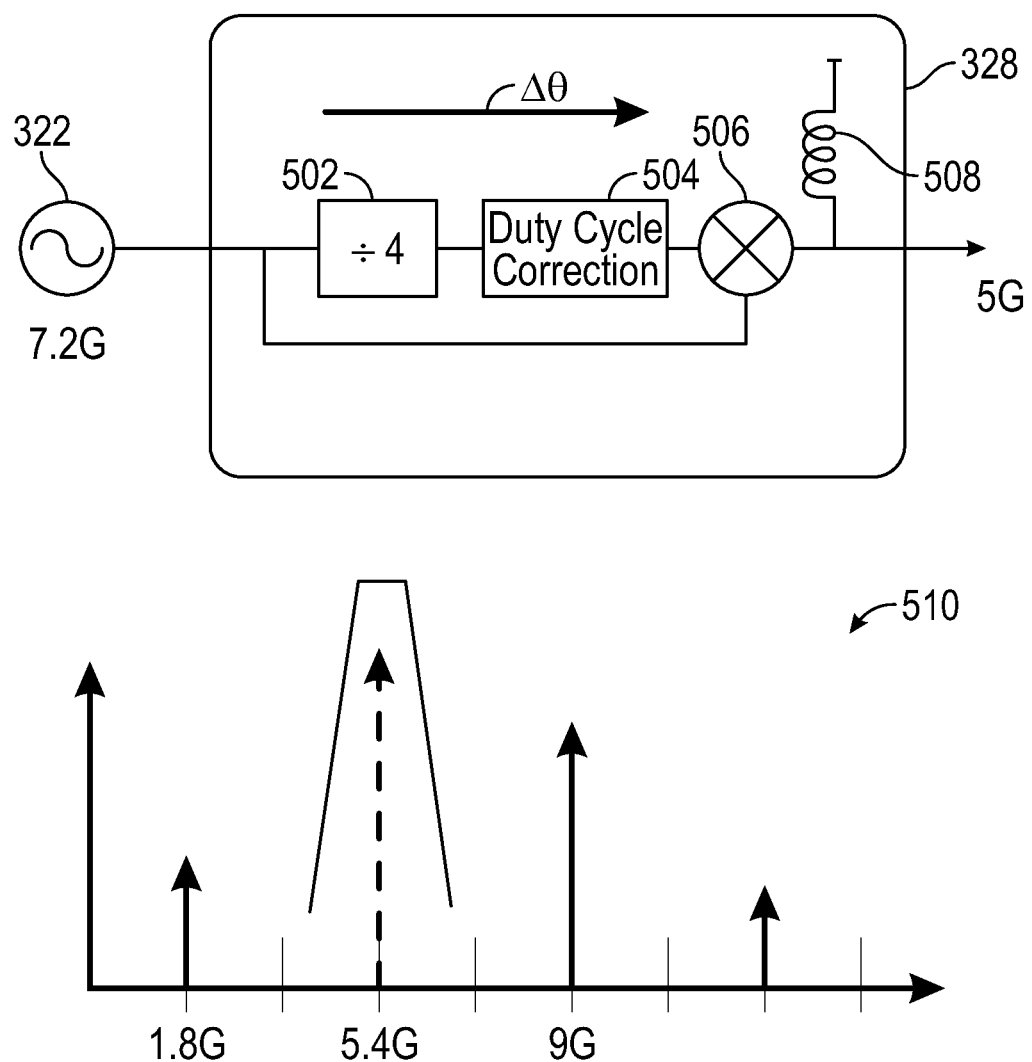
FIG. 5 is a diagram illustrating an example of a traditional fractional divider/multiplier of the transmitter portion as illustrated in FIG. 4 in accordance with one or more implementations.

FIG. 5 is a diagram illustrating an example of a traditional fractional divider/multiplier 328 of the transmitter portion as illustrated in FIG. 4 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Traditional fractional divider/multiplier components in the LO path have eliminated and/or mitigated PA-to-OSC pulling, where the PA (e.g., 330) couples into one or more harmonics of the VCO 322, causing undesirable pulling. The fractional divider/multiplier 328 is typically implemented using a divider 502, a duty-cycle correction circuit 504 and a mixer 506. As shown in FIG. 5, the divider 502 is coupled to the output of the VCO 322, and may be configured to divide the VCO output 322 using a predetermined fraction (e.g., ¾). Although the divider 502 is pictorially shown as a divide-by-four, the divider 502 may divide the input tone signal by any arbitrary number depending on implementation without departing from the scope of the disclosure.

However, this implementation of the fractional divider/multiplier 328 may result in phase noise overhead of the duty cycle-correction circuit 504 and may utilize an inductor 508 at the load point, thus causing performance degradation along the LO path. In some instances, a phase shift observed through the divider 502 and the duty-cycle correction circuit 504 can also result in performance degradation. For example, the input tone signal may be phase shifted in the form of undesirable harmonics across the spectrum. In waveform 510, the undesirable harmonics appear at multiple frequencies around the desirable harmonic at around 5.4 GHz (e.g., harmonics at 1.8 GHz, 9 GHz, and 9+ GHz). The duty cycle correction circuit 504 also consumes a significant amount of power, thus causing further performance degradation for the transmitter portion.

Figure 6:
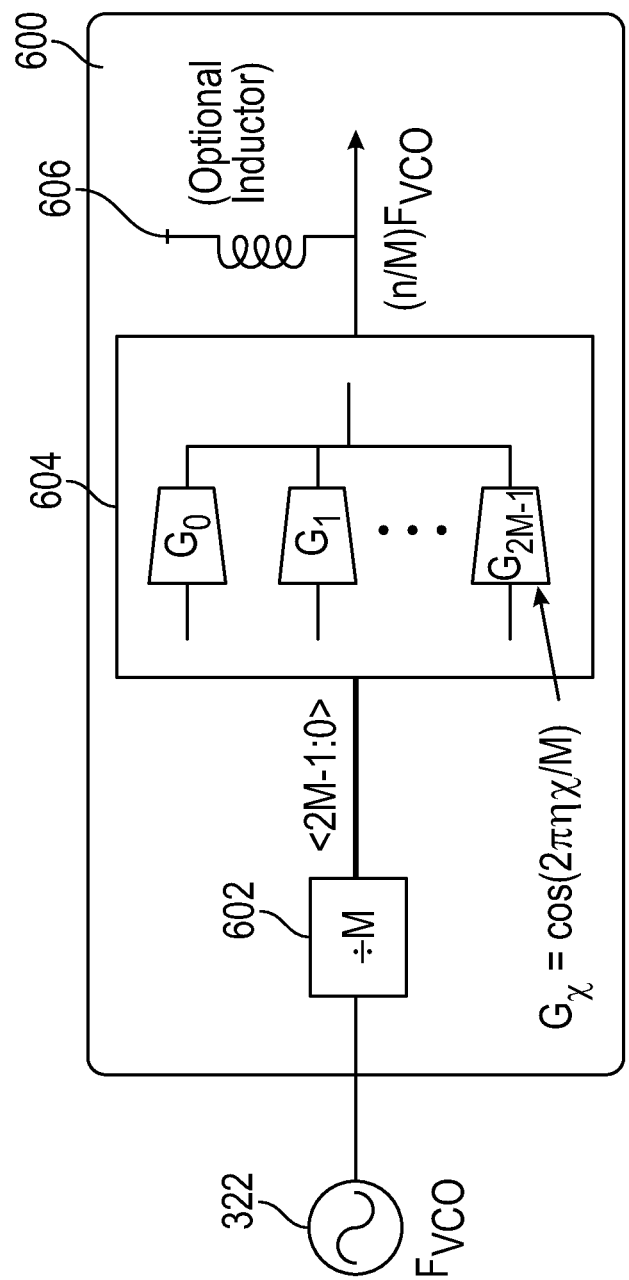
FIG. 6 is a diagram illustrating an example of a multiphase divider in accordance with one or more implementations.

FIG. 6 is a diagram illustrating an example of a multiphase divider 600 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In one or more implementations, a fractional divider/multiplier 600 is disposed on the LO path, where the fractional divider/multiplier includes a divider 602 and an array of weighting cells 604. Each cell of the array of weighting cells 604 is fed with a respective LO signal from the divider 602. The fractional divider/multiplier 600 may be disposed in the transmitter portion 300 of the radio 260 in some implementations, or disposed in a receiver portion of the radio 260 in other implementations.

The divider 602 may be a divide-by-M divider, where M is a positive integer. The divide-by-M divider 602 can generate 2*M phases. Multiple phases of the divider 602 can be used to reconstruct any harmonic (e.g., $(n/M)*F_{vco}$, where n is any integer). This implementation of the fractional divider 600 helps eliminate the need for a duty-cycle correction circuit and mixer, reduce load on the input (e.g., $F_{vco}$), potential to eliminate the need for an inductor, potential for current reduction, and there is no degradation in performance due to any phase shift in the divider 600.

The array of weighting cells 604 are configured to generate one or more phases of a harmonic using a weighting assigned to each of the weighting cells. In one or more implementations, each of the array of weighting cells 604 is configured with a transconductance gain relative to one another. That is, each of the array of weighting cells has a transconductance weighting equivalent to $G_x=k \cos(2\pi nx/M)$, where x is an integer that represents an integer multiple of the wanted signal, M is a number of LO phases employed, n is any integer, and k is an arbitrary constant that determines the effective transconductance of the weighting cell. In some aspects, the constant k has a value approximately to 10. In some aspects, the weighting and a bit arrangement of the plurality of weighting cells are based on the n and M values.

Given that the transconductance weighting produces weighted current signals, the current signals corresponding to harmonic multiples of the wanted signal (i.e. unwanted harmonic blockers) are not passed. This is because the weighting causes the effective transconductance to be substantially large for harmonics corresponding to the wanted signal and zero for harmonics corresponding to the unwanted signals.

In one or more implementations, the array of weighting cells may include unequal weighting, where at least two weighting cells have a different weighting applied. In one or more implementations, the array of weighting cells may include equal (or the same) weighting, where each weighting cell has the same weighting applied. The GM current efficiency between the unequal and equal weighting is about the same efficiency (e.g., 65% v. 63%).

In one or more implementations, an optional inductor 606 is electrically coupled in series with an output of the weighting cell array. The inductor 606 may be employed to remove any of the unwanted signals at other frequencies.

In one or more implementations, the optional inductor 606 at the output of the array of weighting cells may be replaced with an active band pass filter to reduce layout area. The active band pass filter may be a wideband type-I phase-locked loop (PLL). The active band pass filter may be applied to either the equal weighting or the unequal weighting implementations of the weighting cell array.

Figure 7B:
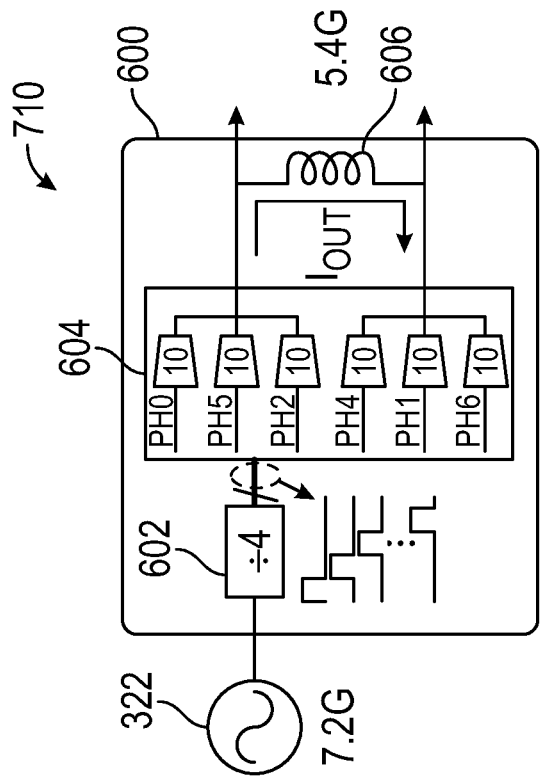
FIG. 7B is a diagram illustrating an example of a multiphase divider with equal weighting in accordance with one or more implementations.
Figure 7A:
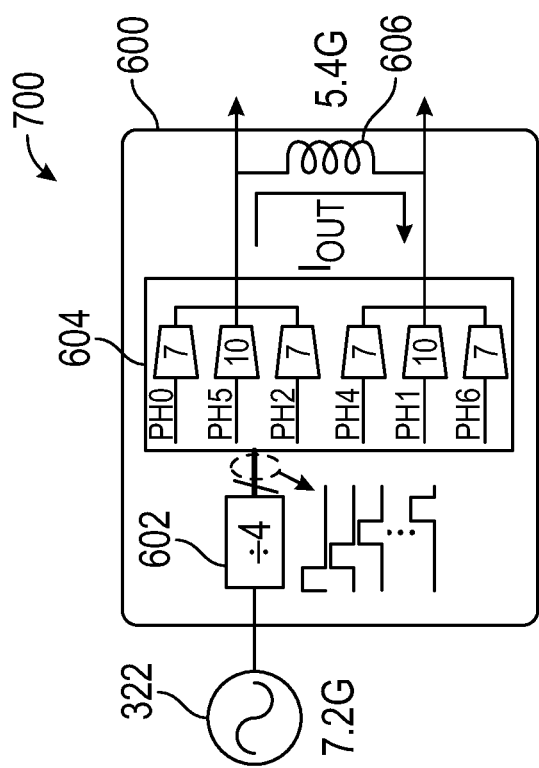
FIG. 7A is a diagram illustrating an example of a multiphase divider with unequal weighting in accordance with one or more implementations.

FIG. 7A is a diagram illustrating an example of a multi-phase divider 700 with unequal weighting in accordance with one or more implementations. Because the features described in FIG. 6 are similar to the features of FIG. 7A, only differences between the figures will be described in reference to FIG. 7A. The multi-phase divider 700 includes an unequal weighting arrangement between the weighting cells, in which certain cells have a weighting of 7 and other cells have a weighting of 10. In some aspects, an output inductor 606 is coupled across the outputs of the weighting cells to further suppress any unwanted harmonics (e.g., 9 GHz) as observed in waveform 702 at the output of the multi-phase divider 700. The LO signals are arranged at certain bit locations depending on the n and M values. For example, in FIG. 7A, a first cluster of weighting cells receives bit locations 0, 5 and 2, whereas a second cluster of weighting cells receives bit location 4, 1 and 6.

FIG. 7B is a diagram illustrating an example of a multi-phase divider 710 with equal weighting in accordance with one or more implementations. Because the features described in FIG. 6 are similar to the features of FIG. 7B, only differences between the figures will be described in reference to FIG. 7B. The multi-phase divider 710 includes an equal weighting arrangement where each of the weighting cells has a weighting of 10. Each of the weighting cells receives bit locations similar to those of FIG. 7A. In some aspects, an output inductor 606 is coupled across the outputs of the weighting cells to further suppress any unwanted harmonics (e.g., 1.8 GHz, 9 GHz, 9+ GHz) as observed in waveform 712 at the output of the multi-phase divider 710. Additional unwanted signals are observed in the waveform 712 due to the equal weighting scheme of the multi-phase divider 710.

FIG. 8A is a diagram illustrating an example of a multi-phase divider 800 with unequal weighting coupled to an active bandpass filter in accordance with one or more implementations. Because the features described in FIG. 6 are similar to the features of FIG. 8A, only differences between the figures will be described in reference to FIG. 8A. The multi-phase divider 800 includes an unequal weighting arrangement between the weighting cells, in which certain cells have a weighting of 7 and other cells have a weighting of 10. Each of the weighting cells receives bit locations similar to those of FIG. 7A. In lieu of the inductor 606, the multi-phase divider 800 includes an active bandpass filter 802 that further suppresses unwanted signals at harmonics outside the wanted signal (e.g., 9 GHz) as observed in waveform 804. The active bandpass filter 802 may be a bandpass filter or any other type of filter that allows passage of wanted signals at certain frequencies without departing from the scope of the disclosure.

FIG. 8B is a diagram illustrating an example of a multi-phase divider 810 with equal weighting coupled to an active bandpass filter in accordance with one or more implementations. Because the features described in FIG. 6 are similar to the features of FIG. 8B, only differences between the figures will be described in reference to FIG. 8B. The multi-phase divider 810 includes an equal weighting arrangement where each of the weighting cells has a weighting of 10. Each of the weighting cells receives bit locations similar to those of FIG. 7A. The multi-phase divider 810 also includes an active bandpass filter 812 that further suppresses unwanted signals at harmonics outside the wanted signal (e.g., 1.8 GHz, 9 GHz, 9+ GHz) as observed in waveform 814. Additional unwanted signals are observed in the waveform 814 due to the equal weighting scheme of the multi-phase divider 810.

Figure 9:
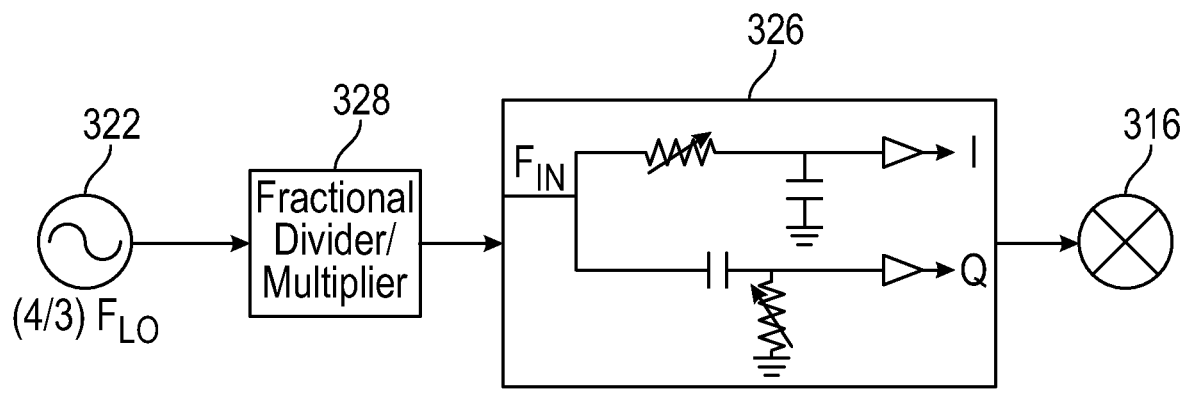
FIG. 9 is a diagram illustrating an example of a traditional I/Q generation circuit in accordance with one or more implementations.

FIG. 9 is a diagram illustrating an example of a traditional I/Q generation circuit 326 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Traditional FQ generation circuitry (e.g., 326) may employ RCCR circuits. In FIG. 9, the intra-phase (I) component is generated from a first path that includes a first variable resistor coupled in series with the input (e.g., FIN) and to a first capacitor. The first capacitor is coupled to ground and to a first output driver. The quadrature (Q) component is generated from a second path that includes a second capacitor coupled in series with the input and to a second variable resistor. The second variable resistor is coupled to ground and to a second output driver.

These RCCR circuits may have several drawbacks, such as 1) utilizing a large layout area dominated by resistors and capacitors, 2) the I/Q accuracy being a function of frequency thereby necessitating tuning, 3) input impedance is resistive thereby placing an undesirable load to previous stages, and 4) RC attenuation of the input signal can be observed to be as much as 3 dB, thereby requiring the need for a buffer to return the signal back to rail-to-rail swing amplitude values, which requires additional power.

Figure 10A:
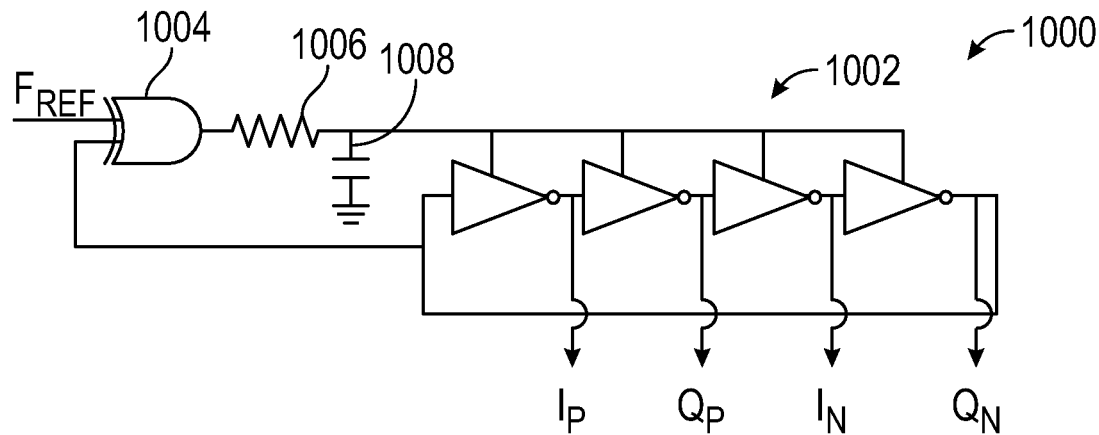
FIG. 10A is a diagram illustrating an example of an I/Q generation circuit using a ring oscillator circuit in accordance with one or more implementations.

FIG. 10A is a diagram illustrating an example of an FQ generation circuit 1050 using a ring oscillator circuit 1002 in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

The I/Q generation circuit 1000 includes a logical gate 1004 coupled in series with a resistor 1006, and a capacitor 1008 coupled in series with the resistor 1006. The FQ generation circuit 1000 also includes a ring oscillator 1002 coupled in series with the capacitor 1008 and to an input to the logical gate 1004 over a feedback path. The ring oscillator 1002 includes multiple inverters series connected to one another, in which an output of each of the inverters produces one of the plurality of phase-shifted clock signals. The ring oscillator 1002 may be configured to generate multiple phase-shifted clock signals from a reference signal that is input to the logical gate 1004, where the I/Q signal is tapped out from respective outputs of the ring oscillator 1002. In one or more implementations, the phase-shifted clock signals are output at intervals of (360/M) degrees, where M is a positive integer. In some aspects, the output of the ring oscillator 1002 is buffered to have the output voltage raised back up to the voltage rail.

In some aspects, the I/Q generation circuit 1000 represents a wideband type-I PLL. The wideband type-I PLL is employed to provide a large bandwidth to suppress ring oscillator noise along the LO path. For example, if the value of the resistor 1006 is relatively large and the capacitance of the capacitor 1008 is relatively smaller, the I/Q generation circuit 1000 would be relatively noisier with a smaller required area. On the other hand, if the value of the resistor 1006 is relatively small and the capacitance of the capacitor 1008 is relatively larger, the I/Q generation circuit 1000 would be relatively quieter with a larger required area. Employing the wideband Type-I PLL may provide several advantages over traditional I/O generation circuitry, including, but not limited to, smaller layout area, improved I/Q accuracy since it is independent of frequency, improved trade-off between phase noise and current, and reduced load impedance since the input impedance is purely capacitive.

Figure 10B:
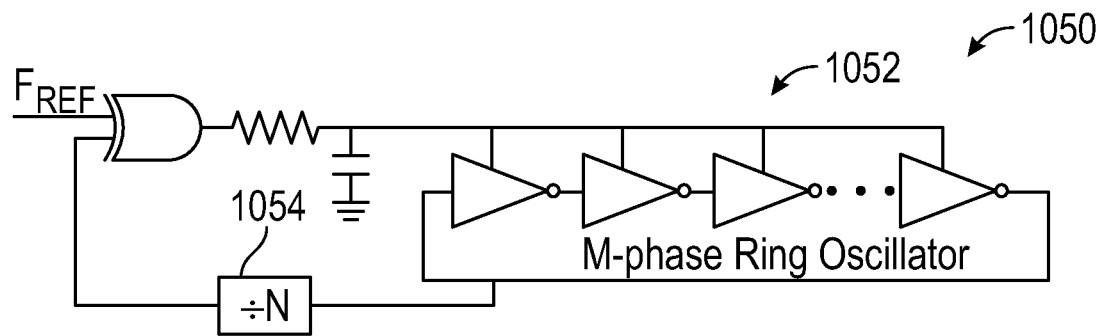
FIG. 10B is a diagram illustrating an example of an I/Q generation circuit using a multi-phase ring oscillator circuit in accordance with one or more implementations.

FIG. 10B is a diagram illustrating an example of an I/Q generation circuit 1050 using a multi-phase ring oscillator circuit in accordance with one or more implementations. Because the features described in FIG. 10A are similar to the features of FIG. 10B, only differences between the figures will be described in reference to FIG. 10B. The I/Q generation circuit 1050 may be disposed in the transmitter portion 300 of the radio 260 in some implementations, or disposed in a receiver portion of the radio 260 in other implementations.

The I/Q generation circuit 1050 includes a logical gate 1004 (e.g., XOR) coupled to a resistor 1006, a capacitor 1008, and to a multi-stage ring oscillator 1052. In some implementations, the I/Q generation circuit 1050 includes a divider circuit 1054 in a feedback path between an output of a last inverter of the series-connected inverters and an input to the logical gate 1004. In some implementations, the I/Q generation circuit 1050 includes a multiplier circuit in the feedback path between the output of a last inverter of the series-connected inverters and the input to the logical gate 1004.

In one or more implementations, the circuit 1050 can generate any number of phases by increasing the number of stages, M, where M is any integer, the multi-stage ring oscillator 1052. For example, a 4-stage ring oscillator can result in a 4-phase output at 90 degree intervals, whereas an 8-stage ring oscillator can result in an 8-phase output at 45 degree intervals.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

As used herein, the terms "chip," "die," "integrated circuit," "semiconductor device," are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Foundries typically provide a limited set of transistor structures that are intended to cover a broad range of circuit applications.

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit comprising:
an oscillator;
a divider coupled to the oscillator, the divider configured to generate one or more phases of a harmonic from the oscillator;
an I/Q generator coupled to the divider, the I/Q generator configured to generate a plurality of phase-shifted clock signals from the harmonic;
a frequency conversion circuit configured to convert the plurality of phase-shifted clock signals to an outbound frequency; and
a power amplifier configured to transmit the frequency converted clock signals,
wherein the divider comprises:
a divide-by-M divider, where M is a number of local oscillator phases employed, and
an array of weighting cells coupled to an output of the divide-by-M divider and configured to generate the one or more phases of the harmonic using a weighting assigned to each weighting cell of the array of weighting cells, and wherein the weighting corresponds to a transconductance gain defined by $G_x = k \cos(2\pi Nx/M)$, where x is an integer that represents an integer multiple of a wanted signal, N is any integer, and k is an arbitrary constant associated with the transconductance gain.

2. The circuit of claim 1, wherein the divider comprises:
an inductor coupled to an output of the array of weighting cells.

3. The circuit of claim 1, wherein the divider comprises:
a filter coupled to an output of the array of weighting cells.

4. The circuit of claim 1, wherein the I/Q generator comprises:
a logical gate;
a resistor-capacitor circuit coupled in series with the logical gate; and
a multi-stage ring oscillator coupled in series with the resistor-capacitor circuit.

5. The circuit claim 4, wherein the I/Q generator comprises:
a divider coupled to the multi-stage ring oscillator and to the logical gate, the divider being configured to generate a number of phases of an output from the multi-stage ring oscillator.

6. A harmonic recombination circuit, comprising:
a divider; and
a plurality of weighting cells coupled to the divider and configured to generate one or more phases of a harmonic using a weighting assigned to each of the plurality of weighting cells, wherein the weighting corresponds to a transconductance gain defined by $G_x = k \cos(2\pi Nx/M)$, where x is an integer that represents an integer multiple of a wanted signal, M is a number of local oscillator phases employed, N is any integer, and k is an arbitrary constant associated with the transconductance gain.

7. The harmonic recombination circuit of claim 6, further comprising an inductor coupled in series with an output of the plurality of weighting cells.

8. The harmonic recombination circuit of claim 6, wherein the weighting and a bit arrangement of the plurality of weighting cells are based on the N and M values.

9. The harmonic recombination circuit of claim 6, wherein the weighting is different for at least two of the plurality of weighting cells.

10. The harmonic recombination circuit of claim 6, wherein each of the plurality of weighting cells has a same weighting.

11. The harmonic recombination circuit of claim 6, further comprising a bandpass filter coupled to an output of the plurality of weighting cells.

12. The harmonic recombination circuit of claim 11, wherein the bandpass filter comprises a wideband Type-I phase-locked loop.

* * * * *